United States Patent [19]
Kleefstra

[11] Patent Number: 5,220,276
[45] Date of Patent: Jun. 15, 1993

[54] CREST FACTOR MEASUREMENT DEVICE

[75] Inventor: Meindert Kleefstra, Solon, Ohio

[73] Assignee: Keithley Corporation, Cleveland, Ohio

[21] Appl. No.: 749,970

[22] Filed: Aug. 26, 1991

Related U.S. Application Data

[63] Continuation-in-part of Ser. No. 713,758, Jun. 11, 1991, Pat. No. 5,103,389.

[51] Int. Cl.$^5$ .................. G01R 19/04; G01R 29/04
[52] U.S. Cl. ........................ 324/103 P; 324/119; 324/140 D
[58] Field of Search ............ 324/103 P, 132, 119, 324/140 D, 76 R; 379/257

[56] References Cited

U.S. PATENT DOCUMENTS 3,502,983  3/1970  Ingle et al. .................. 324/140 D
4,696,031  9/1987  Freudberg et al. ............... 379/257

Primary Examiner—Ernest F. Karlsen
Attorney, Agent, or Firm—Pearne, Gordon, McCoy & Granger

[57] ABSTRACT

The crest value and RMS value of a signal are measured. The ratio of the two values, the crest factor, is calculated to provide a measure of the signal wave shape. The frequency range and accuracy of a commercially available RMS converter is improved by providing an improved rectifier ahead of the converter's internal rectifier. This improved rectifier is also used to form the absolute value of the input signal. A peak detector then provides the crest value (absolute peak value). The crest value and RMS value are multiplexed to a computer having an A/D converter. The RMS value, crest value and crest factor can be calculated and displayed and/or stored by the computer.

3 Claims, 6 Drawing Sheets

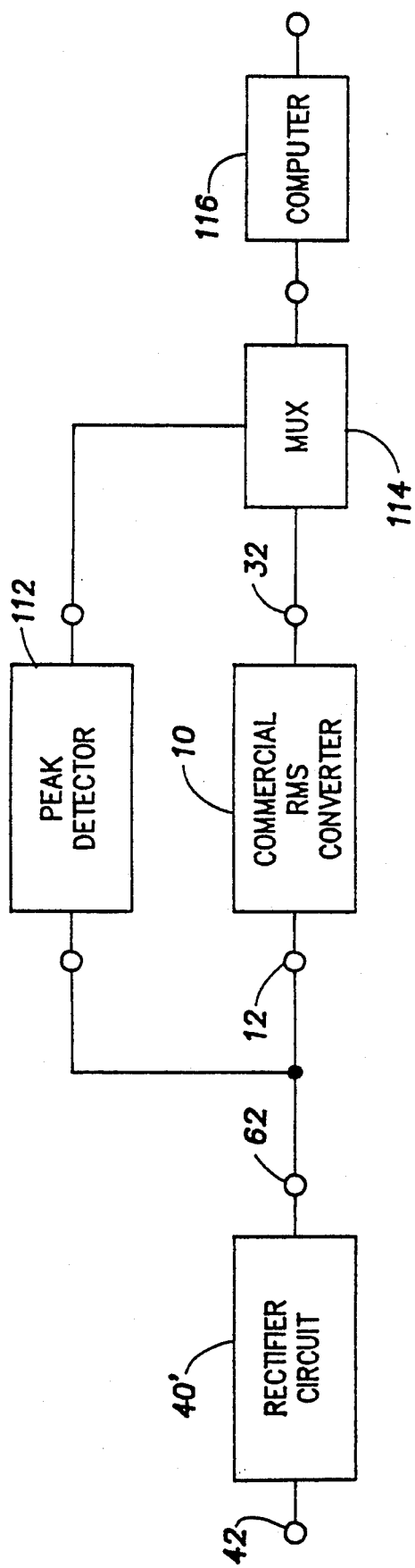
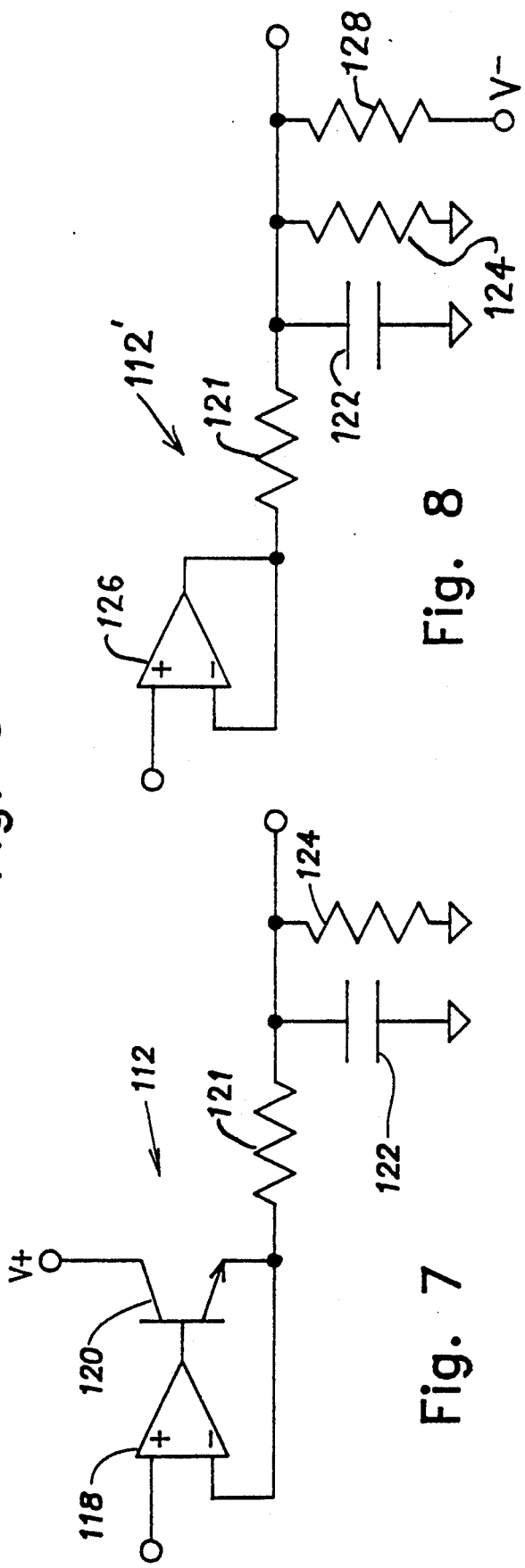
Fig. 6
Fig. 7
Fig. 8

CREST FACTOR MEASUREMENT DEVICE

This is a continuation-in-part of U.S. patent application Ser. No. 07/713758, filed Jun. 11, 1991, now U.S. Pat. No. 5,103,389.

BACKGROUND OF THE INVENTION

The present invention relates to a signal analysis device for providing an indication of an input signal's wave shape, in particular, a crest factor measuring device.

Referring to FIG. 1, a typical commercially available analog log-antilog computing RMS converter 10 is illustrated (e.g., Analog Devices AD637). These RMS converters are provided in the form of pre-packaged integrated circuits.

The input signal is applied to terminal 12. The resistors 14, 16, the op-amp 18, and the diodes 20, 22 act as an inverting half-wave rectifier. The resistors 24, 26 form a summing stage that results in a full-wave rectified version of the input signal at the inverting input of the amplifier 28. The remainder of the RMS converter provides the necessary log-antilog functions and averaging (note the external averaging capacitor 30) in order to provide an output signal at the terminal 32 indicative of the RMS value of the input signal.

The pre-packaged, commercially available RMS converter 10 is typically useful for input signal frequencies up to 100 kilohertz. At 1 megahertz, the error can be as much as 10 percent. This is primarily due to the capacitances of the diodes 20, 22 which prevent the rapid switching of the half-wave rectifier necessary for higher frequency operation.

RMS converters provide a value representative of the direct current equivalent of a time-varying input signal. For many purposes this is an adequate characterization of the input signal. In other cases, the crest or absolute peak value of the input signal is of more importance. In many cases however, some measure of the wave shape of the input signal is desired without the expense or effort of using a device such as an oscilloscope.

SUMMARY OF THE INVENTION

The present invention provides a useful measure of the actual wave shape of the input signal. It does this by forming the ratio of the crest value (absolute peak value) to the RMS value. This ratio is called the crest factor.

The value of the crest factor provides information on the wave shape of the input signal. For example, if the crest factor is 1.0, the wave shape is most likely d.c. or a square wave. Similarly, if the crest factor is 0.707, the wave shape is most likely sinusoidal.

The present invention provides a very accurate high frequency full-wave rectifier. By placing this rectifier ahead of the input to an RMS converter having a rectifier that limits the frequency response of the converter, the frequency range-limiting rectifier is effectively bypassed. Effectively, the internal rectifier is replaced by a rectifier with higher accuracy and frequency range. This allows the converter to be used at much higher frequencies (e.g., 0.5 percent accuracy at 1 megahertz over a wide voltage range).

The rectifier of the invention includes an op-amp having an inverting input terminal, a non-inverting input terminal and an output terminal. The non-inverting input terminal is at a reference voltage;

A comparator responsive to the input signal provides a control signal indicative of the polarity of the input signal.

Also included is a first switch responsive to the control signal. The first switch has a first and second terminal and is "on" when the input signal is of a first polarity and "off" when the input signal is of a second polarity. The first switch first terminal is connected to the op-amp inverting input terminal.

A second switch responsive to the control signal is also included. The second switch has a first and second terminal and is "off" when the input signal is of the first polarity and "on" when the input signal is of the second polarity. The second switch first terminal is connected to the op-amp inverting input terminal.

An inverter having an input terminal and an output terminal is included. The input terminal is connected to the input signal.

A first resistance is connected between the inverter input terminal and the first switch second terminal.

A second resistance is connected between the first switch second terminal and the op-amp output terminal.

A third resistance is connected between the inverter output terminal and the second switch second terminal.

A fourth resistance is connected between the second switch second terminal and the op-amp output terminal.

In operation, a rectified version of the input signal appears at the op-amp output terminal.

The frequency range of an RMS converter having an input terminal and an output terminal may be extended where the input terminal is connected to a frequency range-limiting rectifier within the converter.

An extended frequency range rectifier having an input terminal and an output terminal is provided. The input signal is connected to the extended frequency range rectifier input terminal and the extended frequency range rectifier output terminal is connected to the converter input terminal. In operation, a rectified version of the input signal is applied to the converter thereby extending the frequency range and accuracy of the converter.

In the preferred embodiment, the extended frequency range rectifier is a rectifier as described above.

The invention also includes a signal analysis device. The device includes a crest detector circuit for providing a crest value of an input signal, an RMS converter circuit for providing an RMS value of the input signal and a dividing means for calculating a crest factor in response to the crest value and the RMS value. The crest factor provides an indication of the wave shape of the input signal.

The dividing means includes a multiplexer having two inputs and an output. One of the inputs receives the crest value and the other receives the RMS value. The multiplexer output is adapted to switch between the multiplexer inputs. Also included is an analog-to-digital converter having an analog input and a digital output. The analog input is connected to the multiplexer output. A computing means receives the output of the analog-to-digital converter and calculates the crest factor.

In the preferred embodiment, the crest factor measuring device includes a full-wave rectifier having an input and an output, a peak detector having an input and an output, a root mean-square converter having an input and an output, and a divider having a dividend input, a divisor input and an output.

The detector and converter inputs are connected to the rectifier output, the dividend input is connected to the detector output, and the divisor input is connected to the converter output. When a signal is appied to the rectifier input, it results in a signal indicative of the crest factor appearing at said divider output.

BRIEF DESCRIPTION OF THE DRAWINGS

FIG. 6 is a block diagram of a crest factor measuring device according to the invention;

FIG. 7 is a schematic diagram of a peak detector according to the invention; and FIG. 8 is a schematic diagram of another embodiment of a peak detector according to the invention.

DESCRIPTION OF THE PREFERRED EMBODIMENTS

Figure 1:
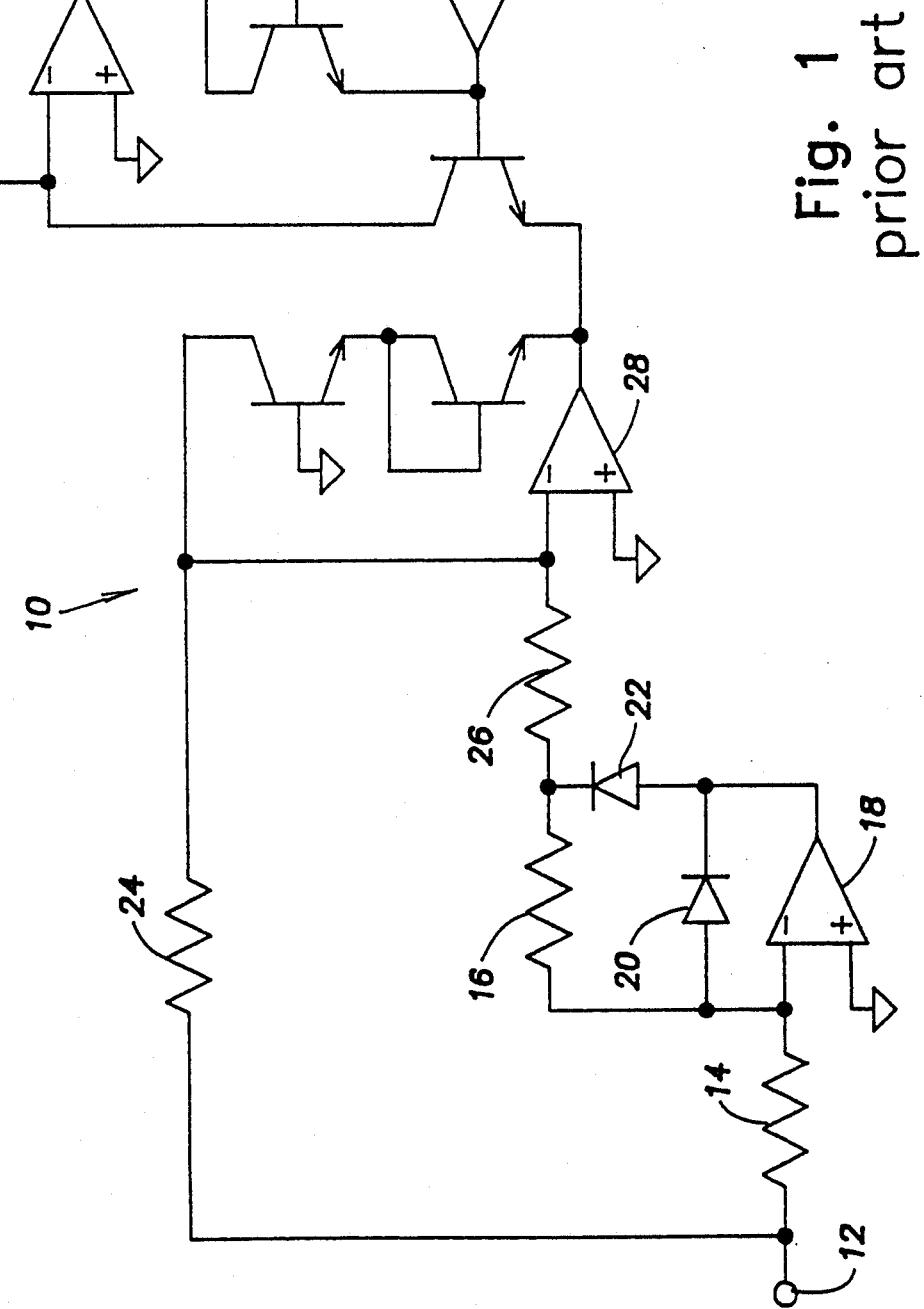
FIG. 1 is a schematic diagram of a typical commercially available RMS converter.
Figure 2:
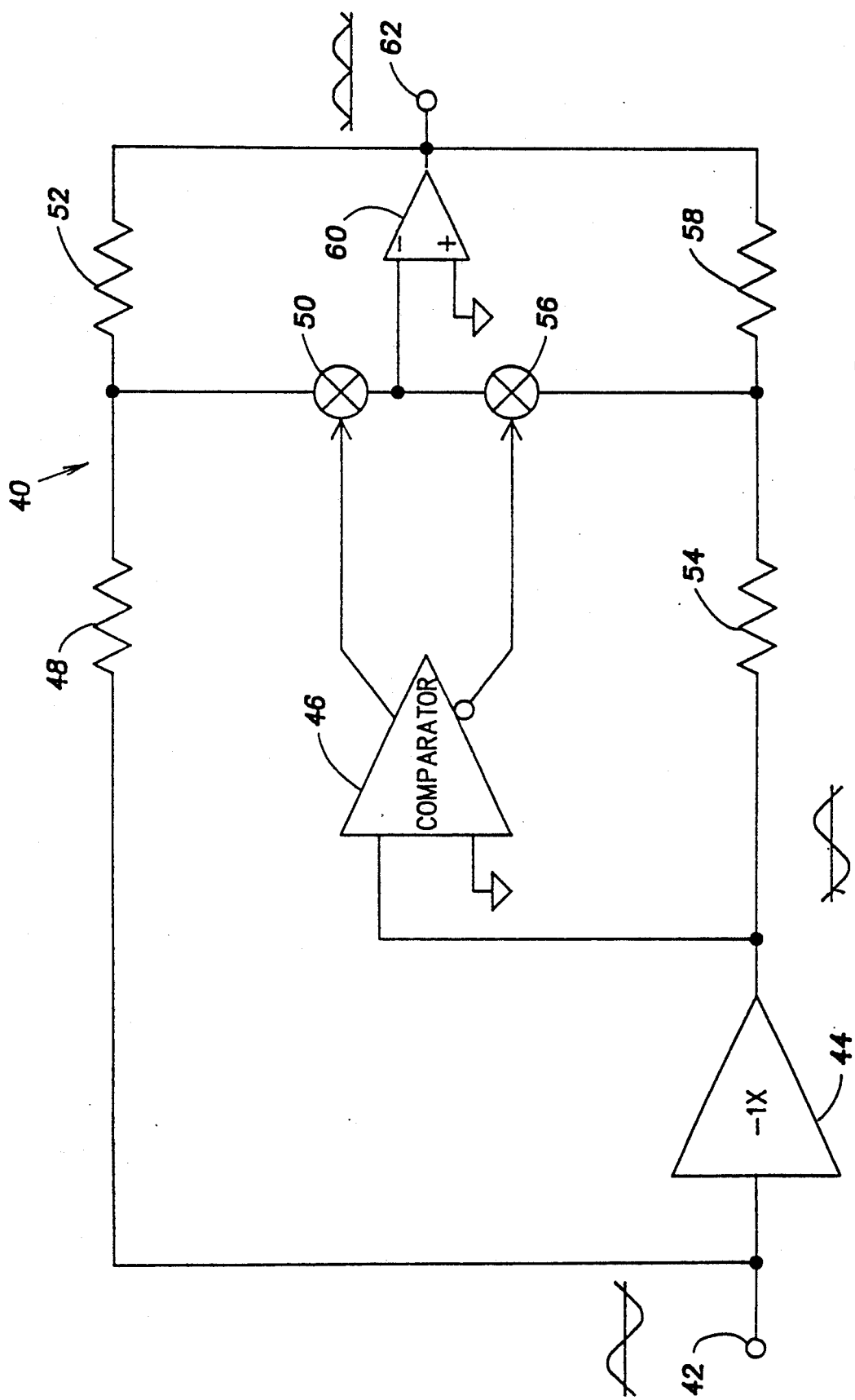
FIG. 2 is a schematic diagram of a rectifier circuit according to the invention.

Referring to FIG. 2, a circuit 40 is illustrated. An input terminal 42 is connected to the input of an inverter 44 and to one terminal of a resistor 48. The other terminal of the resistor 48 is connected to the first terminal of a switch 50 and one terminal of a resistor 52.

The output of the inverter 44 is connected to one terminal of a resistor 54 and to the input of a comparator 46. The other terminal of the resistor 54 is connected to the first terminal of a switch 56 and one terminal of a resistor 58. The reference input of the comparator 46 is connected to signal ground.

The second terminals of the switches 50, 56 are connected to the inverting input of an op-amp 60. The non-inverting input of the op-amp 60 is connected to signal ground. The other terminals of the resistors 52, 58 are connected to the output of the op-amp 60 and to the output terminal 62.

The output of the comparator 46 provides a control signal to the switch 56 and the complemented output of the comparator 46 provides a control signal to the switch 50.

The inverter 44 and the op-amp 60 are accurate, high speed, high slew rate (e.g., greater than 200 volts/microsecond) devices. The comparator 46 may be, for example, a high speed complementary comparator such as a Linear Technology LT1016. The switches 50, 56 may be, for example, DMOS FETs (e.g., Siliconix SD5000).

In operation, an input signal is applied to the input terminal 42. The inverter 44 provides an inverted version of the input signal at its output.

If the input signal is positive, the comparator 46 provides a control signal to the switch 56 to turn "on" the switch 56 to provide the inverted input signal through the resistor 54 to the inverting input of the op-amp 60 and provides a control signal to the switch 50 to turn "off" the switch 50 to block the non-inverted input signal from reaching the op-amp 60.

The signal appearing at the output terminal 62 is then the same as the input signal, except scaled by the ratio of the resistor 58 to the resistor 54.

If the input signal is negative, the comparator 46 provides a control signal to the switch 56 to turn "off" the switch 56 to block the inverted input signal from reaching the op-amp 60 and provides a control signal to the switch 50 turn "on" the switch 50 to provide the input signal through the resistor 48 to the inverting input of the op-amp 60.

The signal appearing at the output terminal 62 is then the same as the input signal, except inverted and scaled by the ratio of the resistor 52 to the resistor 48.

As a result, the signal at the output terminal 62 is never negative, the circuit 40 acting as a full-wave rectifier.

The resistance of the switches 50, 56 when they are "on" will have no effect on the accuracy of the circuit 40 (no current flows through the switches 50, 56).

Figure 3:
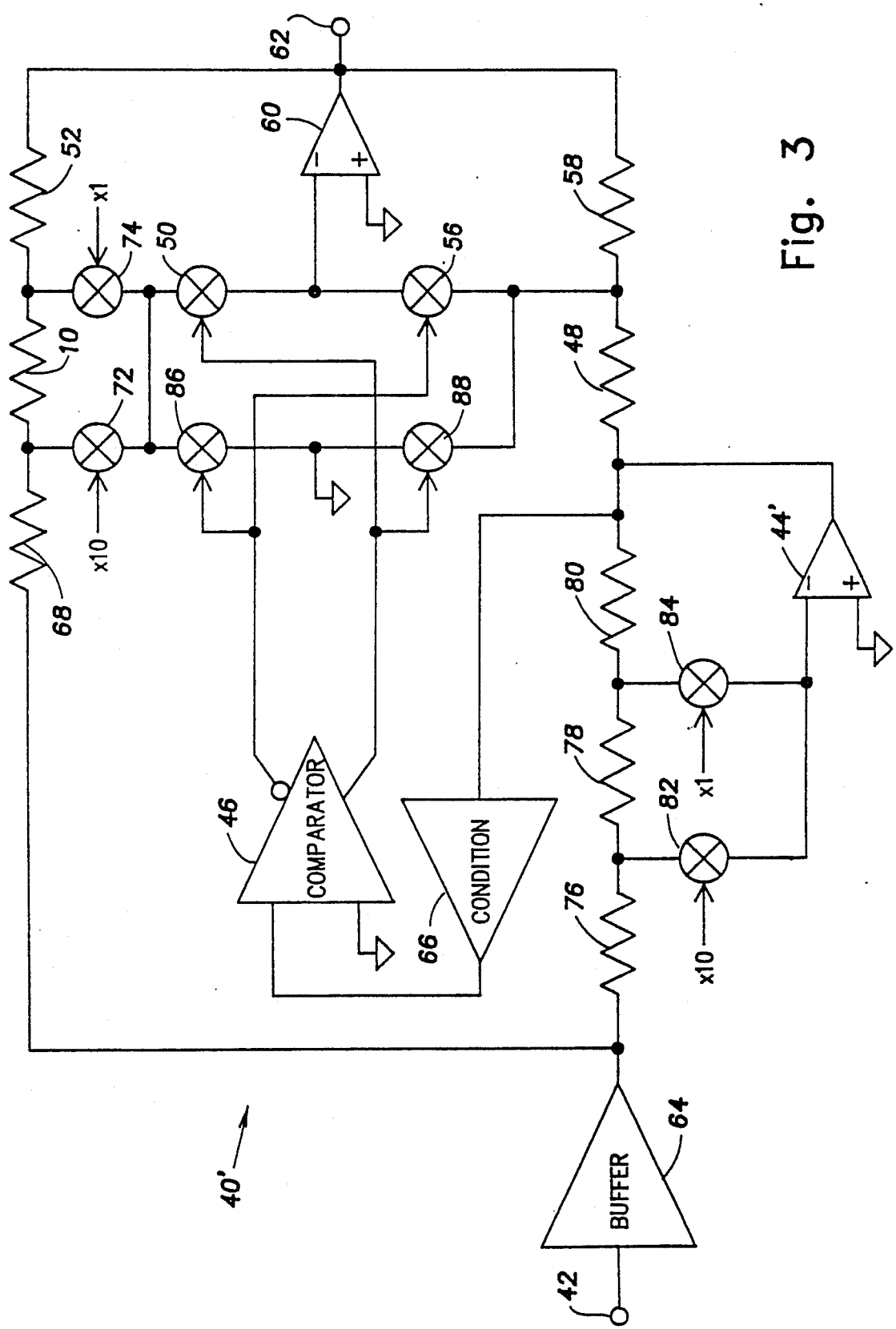
FIG. 3 is a schematic diagram of an additional embodiment of a rectifier circuit according to the invention.

Referring to FIG. 3, circuit 40' is illustrated. The circuit 40' is similar to the circuit 40. A buffer amplifier 64 is added at the input terminal 42 of the circuit 40' and a conditioning amplifier 66 is added at the input of the comparator 46 to ensure reliable switching at extremely low voltages. Both of these amplifiers are accurate, high speed, high slew rate amplifiers.

The resistor 54 has been replaced by resistors 68, 70 and the switches 72, 74. One terminal of the resistor 68 is connected to the output of the buffer amplifier 64. The other terminal of the resistor 68 is connected to one terminal of the resistor 70 and to the first terminal of the switch 72. The other terminal of the resistor 70 is connected to the resistor 52 and the first terminal of the switch 74. The second terminals of the switches 72, 74 are connected to the first terminal of the switch 50.

Range-selecting control signals X1 and X10 control which of the switches 72, 74 are "on". If the switch 72 is on (and the switch 74 off), the resistor 70 is added to the resistor 52 and the gain of the circuit 40' for negative input signals is the negative of the ratio of this sum to the resistor 68. If the switch 74 is on (and the switch 72 off), the resistor 70 is added to the resistor 68 and the gain of the circuit 40' for negative input signals is the negative of the ratio of the resistor 52 to this sum.

The inverter 44 has been replaced by a scaling inverter circuit composed of resistors 76, 78, 80, switches 82, 84 and an op-amp 44'. One terminal of the resistor 76 is connected to the output of the buffer amplifier 64. The other terminal of the resistor 76 is connected to the first terminal of the switch 82 and one terminal of the resistor 78. The other terminal of the resistor 78 is connected to the first terminal of the switch 84 and the first terminal of the resistor 80. The other terminal of the resistor 80 is connected to the input of the conditioning amplifier 66 and to the output of the op-amp 44'. The second terminals of the switches 82, 84 are connected to the inverting input of the op-amp 44'. The non-inverting input of the op-amp 44' is connected to signal ground.

The range-selecting control signals X1 and X10 also control which of the switches 82, 84 are "on". If the switch 82 is on (and the switch 84 off), the resistor 78 is added to the resistor 80 and the gain of the scaling inverter circuit is the negative of the ratio of this sum to the resistor 76. If the switch 84 is on (and the switch 82 off), the resistor 78 is added to the resistor 76 and the gain of the scaling inverter circuit is the negative of the ratio of the resistor 80 to the this sum.

For positive input signals, the gain of the circuit 40' is the negative of the ratio of the resistor 58 to the resistor 48 times the gain of the scaling inverter circuit. Of course, for symmetric full-wave rectification, the gain for negative input signals must be equal to the negative of the gain for negative input signals.

It should be noted that, whatever the polarity of the input signal, the comparator 46 receives a scaled version of the input signal from the scaling inverter circuit, thus scaling is accomplished for both the rectifier and the comparator.

A switch 86 is connected between the first terminal of the switch 50 and signal ground. A switch 88 is connected between the first terminal of the switch 56 and signal ground. The output of the comparator 46 provides a control signal to the switch 88 and the complemented output provides a control signal to the switch 86.

When the switch 50 is "off", the switch 86 is "on" thus zeroing the voltage across the switch 50. Similarly, when the switch 56 is "off", the switch 88 is "on", zeroing the voltage across the switch 56. This is because, while the switches 50, 56 have very low charge injection, very high speed and relatively low "on" resistance, at higher drain voltages, they will turn on independently of the value of the control signals. With the switches 86, 88 added, the switches 50, 56 always have zero voltage across them.

The switches 86, 88 may be, for example, DMOS FETs (SD5000 is a quad-pack of such transistors). The switches 72, 74, 82, 84 may be, for example, low capacitance JFETs.

Figure 4:
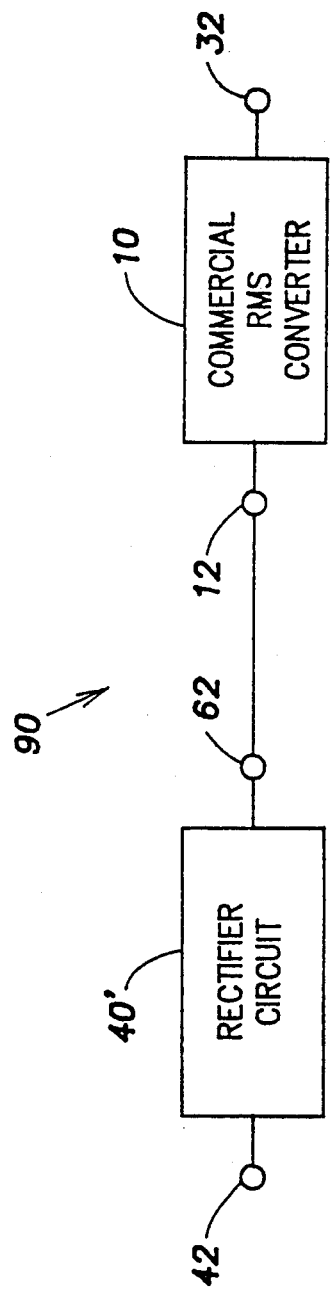
FIG. 4 is a block diagram of an RMS converter according to the invention.

Referring to FIG. 4, an extended frequency range and accuracy RMS converter 90 is shown. The circuit 40' is connected to the input of a pre-packaged, commercially available, RMS converter 10 that contains an internal frequency range-limiting rectifier. Because only a positive signal is passed from the circuit 40' to the converter 10, the internal rectifier of the converter 10 is completely bypassed. This results in an extended frequency range for the converter 90, as well as improved accuracy at very low signal levels (when switching in the internal rectifier becomes uncertain).

The rectifier section of the RMS converter 10 is such that it directly passes positive inputs. If it was instead configured to directly pass negative inputs, the output polarity of the circuit 40' would be inverted (e.g., by changing the sense of the comparator 46).

Figure 5:
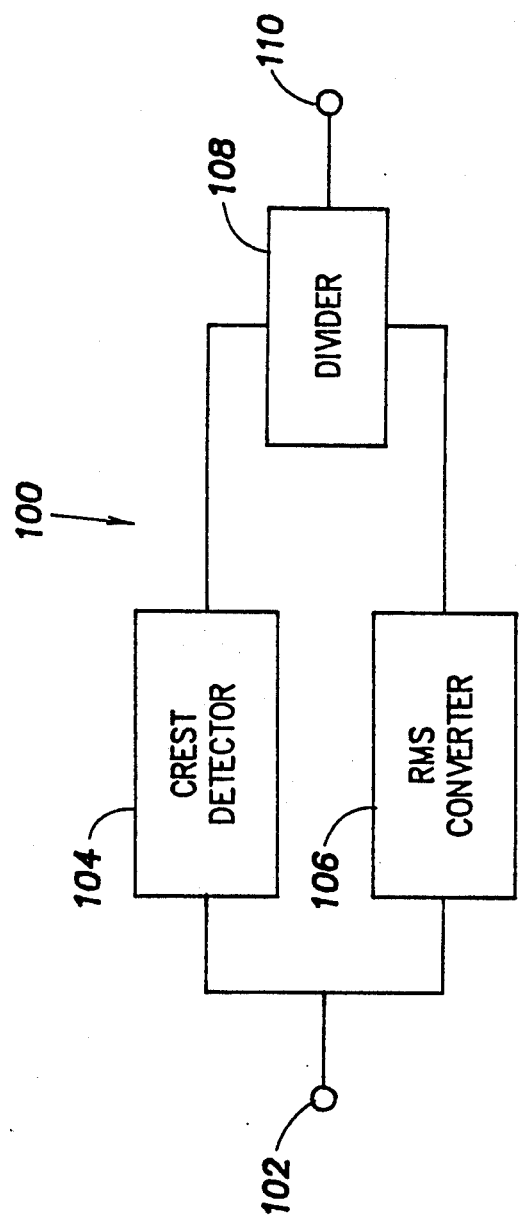
FIG. 5 is a block diagram of a signal analysis device according to the invention.

Referring to FIG. 5, a signal analysis device 100 is shown. An input terminal 102 is connected to the input of a crest detector 104 and to the input of an RMS converter 106. The output of the crest detector 104 is connected to the dividend input of a divider 108. The output of the RMS converter 106 is connected to the divisor input of the divider 108. The divider 108 may be, for example, an analog divider or a digital divider in combination with one or more analog-to-digital converters.

The divider 108 has a quotient, or ratio, output 110.

In operation, a signal is applied to the input terminal 102. This results in the crest value and the RMS value of the signal to appear at the outputs of the crest detector 104 and RMS converter 106, respectively. The divider 108 forms the ratio of the peak value and the RMS value and provides this "crest factor" at the output terminal 110. The crest factor can then be displayed or stored for later use as desired.

In the preferred embodiment shown in FIG. 6, the ability to measure crest factors has been added to the embodiment of FIG. 4. The output of the circuit 40' is additionally applied to the input of a peak detector 112. The output of the peak detector 112 is applied to one input of a multiplexer 114 and the output of the commercial RMS converter 10 is applied to the other input of the multiplexer 114.

The output of the multiplexer 114 is applied to the input of a computer 116 having an analog-to-digital converter therein and being programmed to calculate and display and/or store the ratio of the output of the peak detector 112 to the output of the commercial RMS converter 10.

In operation, the circuit 40' not only improves the frequency response of the converter 10 as described above, but also performs the absolute value function (full-wave rectification) on the signal applied to the input terminal 42. Thus, the peak detector 112 finds the peak value of the absolute value of a signal applied to the input terminal 42, which is, by definition, the crest value. This crest value appears at the output of the peak detector 112.

As described above, the RMS value of the signal applied to the input terminal 42 appears at the output of the converter 10.

The multiplexer 114 is directed by the computer 116 to switch the output of the multiplexer 114 between the inputs from the peak detector 112 and the converter 10. In this way, only a single analog-to-digital converter is required in the computer 116 to measure the crest factor. It would of course be possible to use two analog-to-digital converters, each with its own computer port, but a multiplexer is much less expensive.

The computer 116 samples the crest value and RMS value and calculates and displays and/or stores the crest factor. The computer may sample these values at, for example, a one kilohertz rate. This rate is adequate for input signals of, for example, 1 Hz to 2 MHz.

The computer 112 of course may display and/or store the crest value and the RMS value themselves.

Referring to FIG. 7, an embodiment of the peak detector 112 is shown. The input of the peak detector 112 is the non-inverting input of an op-amp 118. The output of the op-amp 118 is connected to the base of an npn transistor 120. The collector of the transistor 120 is connected to V+. The emitter of the transistor 120 is connected to one terminal of a resistor 121 and to the inverting input of the op-amp 118. The other terminal of the resistor 121 is connected to one terminal of a capacitor 122 and one terminal of a resistor 124.

The other terminals of the capacitor 122 and resistor 124 are connected to signal ground. The output of the peak detector 112 is from the junction of the resistors 121, 124 and the capacitor 122.

In operation, a signal applied to the non-inverting input of the op-amp 118 causes the transistor 120 to turn on, charging the capacitor 122 until the inverting input is at the same level as the non-inverting input, the transistor 120 then being off. If the signal applied to the non-inverting input drops, then the transistor 120 prevents the capacitor 122 from discharging to the output of the op-amp 118. The emitter of the transistor 120 thus stays at the peak value (for a time controlled by the values of R and C for the resistor 124 and the capacitor 122, respectively).

The resistor 124 provides a discharge path for the capacitor 122. A more complicated reset circuit controlled by the computer 116 can be used. However, it has been found that an RC time constant of, for example, 1 second may be adequate (at 50 Hz a maximum error of 2%, 1% for a sine wave).

It should also be noted that the computer 116 can be used to take multiple asynchronous readings of the crest value/factor over a period of time to reduce errors at low frequencies, where the peak detector 112 starts to follow its input. The output of the peak detector 112 at low frequencies is not stable (e.g., 2% at 50 Hz). However, sampling the output, for example, at 1 kilohertz, provides a means to save the peak value over a period of time and use this value for crest value/factor calculations. This will improve the accuracy significantly even at very low frequencies.

Referring to FIG. 8 another embodiment of a peak detector 112' is shown that is very similar to the peak detector 112 but is particularly suitable for high speed "spike" capturing applications. The input of the peak detector 112' is the positive input of a comparator 126. The comparator 126 is of the open-collector type, that is, its output is from the emitter of a transistor similar to the transistor 120 of FIG. 7.

The output of the comparator 126 is connected to one terminal of the resistor 121 and to the negative input of the comparator 126. The other terminal of the resistor 121 is connected to one terminal of the capacitor 122, one terminal of the resistor 124 and one terminal of the resistor 128.

The other terminals of the capacitor 122 and resistor 124 are connected to signal ground. The other terminal of the resistor 128 is connected to V−. The output of the peak detector 112 is from the junction of the resistors 121, 124, 128 and the capacitor 122.

For very abrupt changes at the input of the peak detector 112', the capacitor 122 is charged at maximum current (e.g., 120 milliamps). The resistor 121 prevents overshoot of the output of the peak detector 112' because it takes time to turn the comparator 126 "off" after its input difference reaches zero, while in the meantime the capacitor 122 continues to be charged.

The resistor 121 limits the charging current when the output value of the peak detector 112' is almost equal to the input voltage. In this way, the delay in turn-off has little effect.

There will be some non-linearity at low levels, so the resistor 128 acts as an additional bleeder resistor to remove additional charge from the capacitor 122. At very low signal levels, the current through the resistor 124 is virtually non-existent. At higher levels, there would be no need for the resistor 128 as there is then enough potential across the resistor 124 to cause current therethrough.

It should be noted that while the above peak detectors are positive peak detectors, the invention can also be practiced with negative peak detectors where the output of the rectifier circuit 40' is instead the negative full-wave rectified signal.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A crest factor measuring device for measuring the crest factor of an input signal, comprising:
   a full-wave rectifier including:
      an op-amp having an inverting input terminal, a non-inverting input terminal and an output terminal, said non-inverting input terminal being at a reference voltage;
      a comparator responsive to said input signal for providing a control signal indicative of the polarity of the input signal;
      a first switch responsive to said control signal, said switch having a first and second terminal and being "on" when said input signal is of a first polarity and "off" when said input signal is of a second polarity, said first switch first terminal being connected to said op-amp inverting input terminal;
      a second switch responsive to said control signal, said second switch having a first and second terminal and being "off" when said input signal is of said first polarity and "on" when said input signal is of said second polarity, said second switch first terminal being connected to said op-amp inverting input terminal;
      an inverter having an input terminal and an output terminal, said input terminal being connected to said input signal;
      a first resistance connected between said inverter input terminal and said first switch second terminal;
      a second resistance connected between said first switch second terminal and said op-amp output terminal;
      a third resistance connected between said inverter output terminal and said second switch second terminal; and
      a fourth resistance connected between said second switch second terminal and said op-amp output terminal, wherein a rectified version of said input signal appears at said op-amp output terminal;
   a peak detector having an input and an output, said detector input being connected to said op-amp output terminal, said peak detector providing at said detector output a signal indicative of a peak value of said rectified version of said input signal;
   a root mean-square converter having an input and an output, said converter input being connected to said op-amp output terminal, said root mean-square converter providing at said converter output a signal indicative of a root mean-square value of said rectified version of said input signal; and
   a divider having a dividend input, a divisor input and an output, said dividend input being connected to said detector output and said divisor input being connected to said converter output, said divider dividing said signal indicative of the peak value by said signal indicative of the root mean-square value, wherein a signal indicative of said crest factor appears at said divider output.

2. A crest factor measuring device according to claim 1, wherein said divider comprises:
   a multiplexer having two inputs and an output, one of said inputs being said dividend input and the other being said divisor input, said multiplexer output being adapted to switch between said dividend input and said divisor input;
   an analog-to-digital converter having an analog input and a digital output, said analog input being connected to said multiplexer output; and
   computing means, said computing means being adapted to receive the output of said analog-to-digital converter and provide said signal indicative of said crest factor.

3. A crest factor measuring device for measuring the crest factor of an input signal, comprising:
- an extended frequency range full-wave rectifier having an input and an output, said rectifier providing a rectified version of said input signal at said rectifier output;
- a peak detector having an input and an output, said detector input being connected to said full-wave rectifier output, said peak detector providing at said detector output a signal indicative of a peak value of said rectified version of said input signal;
- a root mean-square converter having an input and an output, said converter having a frequency range-limiting rectifier therein and said converter input being connected to said rectifier output, said converter providing at said converter output a signal indicative of a root mean-square value of said rectified version of said input signal; and
- a divider having a dividend input, a divisor input and an output, said dividend input being connected to said detector output and said divisor input being connected to said converter output, said divider dividing said signal indicative of the peak value by said signal indicative of the root mean-square value, wherein a signal indicative of said crest factor appears at said divider output.

* * * * *